(12) United States Patent
Schneider et al.

(10) Patent No.: US 9,689,946 B2
(45) Date of Patent: Jun. 27, 2017

(54) METHOD FOR MAGNETIC RESONANCE IMAGING WITH OPTIMIZED BACKGROUND PHASE DISTRIBUTION

(71) Applicant: Bruker BioSpin MRI GmbH, Ettlingen (DE)

(72) Inventors: Johannes Schneider, Karlsruhe (DE); Peter Ullmann, Karlsruhe (DE)

(73) Assignee: Bruker BioSpin MRI GmbH, Ettlingen (DK)

( * ) Notice: Subject to any disclaimer, the term of this patent is extended or adjusted under 35 U.S.C. 154(b) by 1108 days.

(21) Appl. No.: 13/863,402

(22) Filed: Apr. 16, 2013

(65) Prior Publication Data

US 2013/0293230 A1    Nov. 7, 2013

(30) Foreign Application Priority Data

Apr. 19, 2012   (DE) .................. 10 2012 206 493

(51) Int. Cl.
| | | |
|---|---|---|
| *G01V 3/00* | (2006.01) | |
| *G01R 33/56* | (2006.01) | |
| *G01R 33/483* | (2006.01) | |
| *G01R 33/561* | (2006.01) | |

(52) U.S. Cl.
CPC ......... *G01R 33/56* (2013.01); *G01R 33/4833* (2013.01); *G01R 33/5612* (2013.01); *G01R 33/5611* (2013.01)

(58) Field of Classification Search
CPC ................................................ G01R 33/5612
USPC ................................ 324/309, 307, 306, 314
See application file for complete search history.

(56) References Cited

U.S. PATENT DOCUMENTS

| | | | |
|---|---|---|---|
| 7,420,370 B2 | 9/2008 | Hinks | |
| 7,888,936 B2 | 2/2011 | Jellus | |
| 7,999,545 B2 | 8/2011 | Ullmann | |
| 8,897,519 B2 * | 11/2014 | Guhring | ............... A61B 5/0263 |
| | | | 382/128 |
| 9,329,252 B2 * | 5/2016 | Bammer | ................ G01R 33/56 |

(Continued)

OTHER PUBLICATIONS

Martin Blamer et al., "Virtual Coil Concept for Improved Parallel MRI Employing Conjugate Symmetric Signals", Magnetic Resonance in Medicine 61:93-102 (2009).

(Continued)

*Primary Examiner* — Louis Arana
(74) *Attorney, Agent, or Firm* — Paul Vincent

(57) ABSTRACT

A method for magnetic resonance (MR) for imaging an imaging area of an object has a reconstruction image quality which depends on a spatial distribution of background phase. A background phase distribution is initially determined using an optimization algorithm having a reconstruction quality as an optimization criterion, wherein limitation of a spatial variation of a background phase offset distribution is integrated as a boundary condition in the optimization algorithm. At least one spatially selective radio frequency pulse is applied which contributes to generation of an MR signal distribution having a previously determined background phase distribution, wherein the at least one spatially selective radio frequency pulse generates the background phase offset distribution as a part of the background phase distribution. In this fashion, the reconstruction quality is improved in a manner which can be realized using available equipment.

17 Claims, 5 Drawing Sheets

(56) References Cited

U.S. PATENT DOCUMENTS

| | | | |
|---|---|---|---|
| 9,538,936 B2* | 1/2017 | Kimura | A61B 5/055 |
| 2008/0238425 A1 | 10/2008 | Xu | |
| 2010/0253336 A1 | 10/2010 | Schneider | |
| 2011/0080169 A1 | 4/2011 | Haas | |
| 2011/0188721 A1* | 8/2011 | Greiser | G01R 33/56316 382/131 |
| 2016/0252597 A1* | 9/2016 | Liu | A47L 23/04 |

OTHER PUBLICATIONS

Daniel K. Sodickson et al., "Simultaneous Acquisition of Spatial Harmonics (SMASH): Fast Imaging with Radiofrequency Coil Arrays", MRM 38-591-603 (1997).
Mark A. Griswold et al., "Generalized Autocalibrating Partially Parallel Acquisitions (GRAPPA)", Magnetic Resonance in Medicine 47:1202-1210 (2002).
Klaas P. Pruessmann et al., "SENSE: Sensitivity Encoding for Fast MRI", Magnetic Resonance in Medicine 42:952-962 (1999).
Mark Bydder et al., "Partial Fourier Partially Parallel Imaging", Magnetic Resonance in Medicine 53:1393-1401.
Jacob D. Willig-Onwuachi et al., "Phase-constrained parallel MR image reconstruction", Journal of Magnetic Resonance 176 (2005) 187-198.
F. Seifert et al., "$B_1(+)$ steering by an adaptive 4-channel transmit/receive coil array", Proc. Intl. Soc. Mag. Reson. Med. 11 (2004).
Pauly J. Nishimura et al., "A k-space analysis of small-tip-angle excitation", Journal of Magnetic Resonance 81 (1989), Pa. 43-56.
Ulrich Katscher et al., "Transmit SENSE", Magnetic Resonance in Medicine 49:144-150 (2003).
Dan Xu et al., "Designing Multichannel, Multidimensional, Arbitrary Flip Angle RF Pulses Using an Optimal Control Approach", Magnetic Resonance in Medicine 59:547-560 (2008).
M. Haas et al., "Large Tip Angle Parallel Excitation Using Non-linear Non-Bijective PatLoc Encoding Fields", Proc. Intl. Soc. Mag. Reson. Med. 18 (2010).
Felix A. Breuer et al., "General Formulation for Quantitative G-factor Calculation in GRAPPA Reconstructions", Magnetic Resonance in Medicine 62:739-746 (2009).
Rita G. Nunes "Combining RF encoding with parallel imaging: a simulation study" Megn Reson Mater Phy (2010) 23:31-38.

* cited by examiner

METHOD FOR MAGNETIC RESONANCE IMAGING WITH OPTIMIZED BACKGROUND PHASE DISTRIBUTION

This application claims Paris Convention priority of DE 10 2012 206 493.1 filed Apr. 19, 2012 the complete disclosure of which is hereby incorporated by reference.

BACKGROUND OF THE INVENTION

The invention concerns a method for magnetic resonance (MR) imaging for imaging an imaging area of an object, wherein a spatial MR signal distribution with a background phase distribution is generated, MR signals are acquired, the spatial MR signal distribution is reconstructed, and an MR image is stored and/or displayed, wherein the reconstruction quality depends on the spatial distribution of the background phase, and wherein the background phase distribution to be generated is determined by means of an optimization algorithm with the reconstruction quality as optimization criterion.

A method of this type is disclosed e.g. by reference [1].

Magnetic resonance imaging (MRI), which is also called magnetic resonance tomography (MRT), is a widely used technology for non-invasive acquisition of images of the inside of an object under investigation and is based on spatially resolved measurement of magnetic resonance signals from the object under investigation. By subjecting the object under investigation to a substantially static and homogeneous magnetic basic field (also called the main magnetic field) within the measuring volume of a magnetic resonance measuring apparatus, the nuclear spins contained in the object under investigation are oriented with respect to the direction of the basic field, generally selected as the z direction of a magnet-bound coordinate system. The associated orientation of the magnetic dipole moments of the atomic nuclei results in magnetization within the object in the direction of the main magnetic field, which is called longitudinal magnetization. In the MR investigation (MR: magnetic resonance), this magnetization within the object under investigation is excited into a precession movement, the frequency of which is proportional to the local magnetic field strength, through irradiation of electromagnetic RF pulses (RF: radio frequency) using one or more RF transmitting elements of a transmitting antenna device. The vector of magnetization is thereby deflected from the equilibrium position (z direction) through an angle, which is referred to below as the deflection angle.

In the MRI methods used nowadays, a spatial encoding is impressed on the precession movements of the nuclear spins for all three spatial directions through time-variant superimposition of additional spatially dependent magnetic fields, which are referred to below as additional magnetic fields. These additional magnetic fields usually comprise substantially constant gradients of the z component in the spatial directions x, y, and z within the object under investigation, and are generated by a coil configuration, which is referred to as a gradient system, the coils being controlled by one so-called gradient channel for each spatial direction. However, for some years there have been different imaging technologies which also use non-linear additional magnetic fields with spatially varying gradients. In the following, linear and non-linear magnetic fields always refer to the spatial dependence of the z component of the fields unless otherwise specified. Spatial encoding is usually described by a scheme in a space conjugated from the position space via Fourier transformation, the so-called k space. Switching of additional magnetic field pulses can be described as passage of a trajectory in k space, the so-called k space trajectory in this k space formalism. This can only be applied when magnetic fields are used having a spatially constant gradient, wherein data is acquired as described below at certain points in k space determined by the spatial encoding scheme. The density of these data points and the extension of the amount of data points in k space determine the so-called "field of view" or spatial resolution with which the object under investigation or parts thereof are imaged.

The transverse component of the precessing magnetization associated with the nuclear spins (also called transverse magnetization below) induces electric voltage signals (which are also called magnetic resonance signals (MR signals)) in one or more RF receiving antennas which surround the object under investigation. Time-variant magnetic resonance signals are generated by means of pulse sequences, which contain specially selected sequences of RF pulses and additional magnetic field pulses (temporary application of time-constant or time-variant additional magnetic fields) in such a fashion that they can be converted into corresponding spatial images. According to one of a plurality of well-known reconstruction technologies, this is realized after acquisition, amplification and digitization of the MR signals using an electronic receiver system, processing thereof by means of an electronic computer system, and storage thereof in one-dimensional or multidimensional data sets. The pulse sequence used typically contains a sequence of measuring processes called spatial encoding steps in which the gradient pulses are varied in accordance with the selected spatial encoding method. The number of spatial encoding steps and the duration thereof, except for averagings and repetitions, substantially determine the duration of an MR imaging experiment.

Parallel Imaging (PI) in MRT was first presented in 1997 (reference [2]) and is based on the use of RF receiving antenna arrays which consist of several antenna elements for simultaneous data acquisition, the spatial variation of the receiving sensitivity (sensitivity) of which is used for additional spatial encoding of the MR signal. Parallel imaging enables reduction of the number of acquired data points in k space and associated reduction of the number of acquired data points in k space and therefore reduction of the acquisition time, while maintaining the resolution with respect to space and time or increasing the resolution with respect to space and time for identical acquisition time. The reduction of the acquired data points by a reduction factor R is associated with subsampling of k space, i.e. in parallel imaging not all data points are measured which would be required for complete sampling of k space according to Nyquist. This results in spatial convolution of the images in standard Fourier reconstruction. Parallel imaging algorithms, however, utilize the spatial information contained in the sensitivities in order to either supplement the missing data in k space (e.g. GRAPPA, reference [3]) or eliminate the convolution artefacts in the image space (e.g. SENSE, reference [4]).

One problem with the implementation of such PI technologies is the fact that use of parallel imaging with increasing reduction factors results in a considerable increase in reconstruction artefacts in the images and also in a dramatic drop in signal-to-noise ratio (SNR) in the reconstructed images. This SNR drop substantially has two reasons. On the one hand, in MRT the SNR is generally proportional to the square root of the number of acquired data points. On the other hand, in parallel imaging additional noise increase often occurs as a result of the frequently poor numerical conditions of the parallel re-construction problem. In a SENSE reconstruction, this noise increase can be quantitatively described for each point in the image in a simple fashion via the so-called local geometry factor (g factor) (see also reference [4]). This simple analytic description of the noise gain is not possible with GRAPPA, however, there are also methods for quantifying the noise increase for this case (reference [12]).

In order to be able to further increase the reduction rates or reduce the noise increase, a number of improved parallel imaging methods have been developed in recent years, which e.g. combine PI with partial Fourier imaging (e.g. reference [5]) or utilize complexly conjugated symmetry relations in k space by using a priori knowledge about the image phase in the PI reconstruction process (e.g. reference [6]). A further method which is based on such complexly conjugated symmetry relations is the so-called Virtual Coil Concept (reference [1]). This method calculates "virtual MR signals" from "virtual receiving antennas". These signals then consist of complexly conjugated symmetrical signals of the real receiving antennas and contain additional phase information. The integration of this additional virtual data in the PI reconstruction process contributes to an improvement in the numerical conditions of reconstruction.

One common property of all above-explained methods is that the spatial dependence of the so-called background phase of the MR signal distribution has a significant influence on the degree of improvement of the reconstruction quality that can be achieved, thereby e.g. reducing the noise increase. MR signal distribution in this context means the transverse magnetization that is present in the object under investigation at the time of data acquisition. The background phase thereby defines that phase which would contain the MR signal distribution without taking into consideration the phase portion which is generated through spatial encoding using additional magnetic fields and which is again eliminated through decoding within the scope of conventional reconstruction methods.

The influence of the background phase on the reconstruction quality will be exemplarily explained below on the basis of the "Virtual Coil Concept".

In an MR imaging experiment with several receiving antennas, the k space signal $S_j(k)$ received by antenna j (j=1 ... m) is represented below:

$$S_j(k)=\int dx \rho(x)e^{i\phi(x)}C_j(x)e^{-ikx} \qquad (1)$$

wherein $\rho(x)$ and $\phi(x)$ designate the real amplitude and the back-ground phase of the spatial MR signal distribution and $C_j(x)$ designates the complex spatial receiving sensitivity (sensitivity) of the receiving antenna. One can now introduce a so-called effective sensitivity $D_j(x)=e^{i\phi(x)}C_j(x)$ for each antenna by combining the background phase with the sensitivity. In this fashion $S_j(k)$ can be written as Fourier transform of the spatial signal distribution multiplied by the effective sensitivity $$S_j(k)=FT[\rho(x)D_j(x)] \qquad (2)$$

Considering now the symmetrical complexly conjugated k space signal, one obtains the following, since $\rho(x)$ is a purely real quantity:

$$S_j^*(-k)=\int dx \rho(x)e^{-i\phi(x)}C_j^*(x)e^{i(-k)x} \qquad (3)$$

wherein "*" designates the operation of complex conjugation.

By now introducing a second set of m so-called "virtual coils", the effective sensitivities of which are defined by $D_v(x)=D_j^*(x)=e^{-i\phi(x)}C_j^*(x)$, with v=j+m, a second set of k space data can be introduced, which corresponds to the symmetrical complexly conjugated k space data of the real coils and which can now be represented as Fourier transforms of the spatial signal distribution multiplied by the effective sensitivities of the virtual coils:

$$S_v(k)=S_j^*(-k)=FT[\rho(x)D_j^*(x)]FT[\rho(x)D_v(x)] \qquad (4)$$

These relationships clearly show that when k space data of these virtual coils is used in the PI reconstruction process, additional information is introduced into this process, thereby contributing to an improvement of the condition which is generally given with $D_j(x) \neq D_j^*(x)$ and which means that the effective sensitivity of the real coils must not be purely real. The degree of improvement of the condition by this means depends on the detailed spatial dependence of the phase of the effective sensitivities. Since the background phase of the MR signal distribution is an essential component of the phase of the effective sensitivities, specific manipulation of this background phase can optimize the condition of the reconstruction problem. This applies, except for the "Virtual Coil Concept", in a similar fashion also for the other above-mentioned improved PI methods. At this point, it has to be mentioned that manipulation of the background phase improves the reconstruction quality not only for parallel imaging. There are special cases, in which such an optimized background phase also improves the reconstruction when only one receiving antenna is used. For example, when only one individual antenna is used for reception, the use of the "Virtual Coil Concept" is analogous to the application of a "Half-Fourier" reconstruction. Numerous experimental parameters are included in the background phase, such as the properties of the imaging sequence used (e.g. number, flip angle and phase of the RF pulses used, echo times, applied additional magnetic fields), physical parameters in the object under investigation (e.g. off resonances due to field inhomogeneities or chemical shift) and last but not least properties of the emitting antennas (e.g. spatial phase distribution of the magnetic transmitting field). This versatile dependence of the background phase therefore also provides the possibility of influencing the spatial distribution thereof during an imaging experiment, thereby improving the reconstruction quality.

In practice, a dependence of the background phase must be initially determined for this purpose, thereby utilizing the dependence between reconstruction quality and background phase distribution by means of an optimization algorithm, which optimizes the reconstruction quality. In a further step, this background phase dependence would then have to be impressed on the spatial MR signal distribution in an experiment.

Despite the above-described versatile dependencies of the background phase, there is currently no prior art method for experimentally realizing complexly formed background phase distributions which would often be necessary for an optimum reconstruction quality.

This is, in particular, due to the fact that the phase dependencies resulting from optimization methods according to prior art (e.g. reference [1]) often have very small-scale phase variations, numerous phase jumps and, in the extreme case, noise-like patterns which cannot be experimentally utilized in this form. As a result thereof, reference [1] states that the optimum phase distributions could not be generated and applied in actual experiments so far.

It is therefore the underlying purpose of the present invention to present a method which provides an improved reconstruction quality in comparison with conventional imaging methods with standard reconstruction, and at the same time can be realized with means that are available.

SUMMARY OF THE INVENTION

In accordance with the invention, this object is achieved by a method in accordance with the independent claim.

In the inventive method, at least one spatially selective radio frequency pulse is applied, which contributes to generation of the MR signal distribution with the previously determined background phase distribution, wherein the spatially selective radio frequency pulse generates a background phase offset distribution which is part of the background phase distribution. The background phase offset distribution is determined within the scope of the inventive optimization algorithm, wherein limitation of the spatial variation of the background phase offset distribution is integrated in the optimization algorithm as a boundary condition.

Whereas the optimization algorithms described in prior art, e.g. in reference [1], for determining an optimum dependence of the background phase are designed in such a fashion that the single optimization criterion is optimum reconstruction quality, the inventive method takes into consideration the limitation of the spatial variation of the background phase offset distribution as a boundary condition, which enables experimental realization of the background phase offset distribution using spatially selective pulses with acceptable accuracy and effort.

Within the scope of this description, spatially selective radio frequency pulses are defined as those radio frequency pulses which, due to their degrees of freedom, permit simultaneously realization of different changes of the state of magnetization at different locations of the object. The two spatially selective radio frequency pulses that are used most frequently in prior art and are preferably used for the inventive method are explained by way of example below:

The first of the two variants is the so-called "$B_1$-Tailoring", often also called "$B_1$-Shimming" if used to generate a homogeneous $B_1$ field in certain areas of the object under investigation (see reference [7]). During $B_1$-Tailoring, radio frequency pulse waveforms are applied to an object under investigation using a plurality of RF transmitting elements of a transmitting antenna device. Since each of these transmitting elements has an individual $B_1$ field distribution in the area of the object, an individual amplitude and phase of the $B_1$ field can be independently obtained within certain limits at different locations in dependence on the number of available transmitting elements and therefore on the available degrees of freedom in that the same RF waveform is supplied to each of the transmitting elements, which, however, has an individual amplitude factor and phase offset. Within the scope of a radio frequency pulse, an individual change of the magnetization state can be produced at the different locations using such different $B_1$ fields. At this point it should be clarified that the term "RF pulse" within the scope of the invention always defines the collectivity of all RF waveforms irradiated within a certain time interval, if necessary, via several transmitting channels and transmitting elements.

The second type of spatially selective radio frequency pulses are the so-called spatially selective RF pulses based on additional magnetic fields (ZRSHFP) (see also reference [8]). These are well known in magnetic resonance imaging and are used to transfer a magnetization distribution in an object under investigation, which exists at a certain point of time in dependence on the location through irradiation of RF pulses in combination with additional magnetic fields which vary with respect to space and time and are superimposed on the static and homogeneous basic field of the magnetic resonance apparatus, into a new magnetization distribution, i.e. the magnetization present at each location within the object under investigation is selectively specifically changed for each location within the object under investigation or is transferred into a state that is predetermined for this location. Combination means both simultaneous irradiation of RF pulses and application of additional magnetic fields as well as nested application of additional magnetic fields and RF pulses.

With ZRSHFP, spatial encoding is performed during transmission of RF pulses via the additional magnetic fields in order to realize a spatial selectivity which enables simultaneous realization of different changes of the state of magnetization at different locations of the object, although the RF pulses per se have at first no spatial selectivity. This spatial encoding during transmission must be distinguished from classic spatial encoding in the acquisition case, which is performed within the scope of data acquisition in a period after excitation without RF irradiation, in particular, also during data acquisition.

One example for the use of ZRSHFP is spatially selective excitation which is used to generate transverse magnetization with spatial limitation in an excitation volume, and/or to spatially vary its amplitude and phase in correspondence with predetermined distributions.

In the past, the ZRSHFP were at first realized using one single RF transmitting antenna with a substantially homogeneous transmission field ($B_1$-Feld) in combination with the gradient system. Inspired by the success of parallel imaging, in which the signal is acquired with a configuration of several RF antennas, also called antenna array in technical literature, which consists of several individual antennas or elements, one has started in the meantime to also use such antenna arrays consisting of several elements for transmission with ZRSHFP, which are operated on several independent RF transmission channels of the MR measuring apparatus. With this method, which is i.a. also known by "Transmit SENSE" (see also reference [9]), it is possible to partially replace spatial encoding, which is realized for ZRSHFP analogously to data acquisition through variation of additional magnetic fields, by so-called sensitivity encoding, thereby reducing the length of the RF pulses. This means that the different spatial variations of the RF transmission fields of the individual array elements (called transmission profiles below) are utilized. Since the length of spatially selective RF pulses based on additional magnetic fields was usually one of the limiting criteria for the applicability of this technology in the single channel transmission case, Transmit SENSE is a very promising approach for using ZRSHFP on a wider scale than up to now. The Transmit SENSE technology can not only be used for deflecting magnetization from the longitudinal direction and therefore for generating transverse magnetization but also for spatially selectively changing an existing state of magnetization which may already include transverse magnetization. So-called selective refocusing pulses or inversion pulses are examples of pulse types that can be used in this connection.

Additional magnetic fields may be used for ZRSHFP, which have one spatially constant gradient in each spatial direction in the overall measuring volume of the MR measuring apparatus. Due to this property of covering the overall measuring volume, these additional magnetic fields are referred to as global gradients, the generating system component is referred to as global gradient system. So-called local gradient systems may also be used, which generate additional magnetic fields that have a non-linear and possibly also non-bijective dependence in the area of the object under investigation. These local gradient systems may be advantageous for generating higher additional magnetic field strengths and may be advantageous for the switching speed of such additional magnetic fields.

Various factors contribute to the background phase distribution, in particular, applied RF pulses (both spatially selective and possibly applied non-selective), off-resonances, additional magnetic fields, wherein the contribution of the applied spatially selective pulses in accordance with the invention is called "background phase offset distribution". The spatially selective radio frequency pulses generally also have an influence on the amplitude distribution of the MR signal distribution, which can be used for other purposes within the scope of the still available degrees of freedom of the spatially selective radio frequency pulse, such as e.g. for spatial limitation of the generated MR signal distribution for imaging an inner volume of the object under investigation.

Preparation of the magnetization and therefore of the spatial MR signal distribution with a certain dependence of the background phase by spatially selective RF pulses can be performed e.g. directly during excitation, which is, however, only one of a large number of possibilities of manipulating the background phase by one or several spatially selective radio frequency pulses within the scope of an MR imaging sequence. Spatially selective refocusing or inversion pulses can e.g. also contribute to manipulation of the background phase.

By means of the inventive optimization algorithm, a background phase distribution, which is optimized for reconstruction quality, is determined which contains a portion (background phase offset distribution) which must meet the predetermined boundary condition (limitation of the spatial variation of the background phase offset distribution). The spatial variation of the background phase offset distribution is thereby limited in dependence on the performance, in particular, on the spatial resolution, of the spatially selective RF pulse(s).

The inventive method utilizes the fact that several spatial dependencies of the background phase exist for an MR signal distribution, which permit optimum or at least very good reconstruction. The inventive method enables generation of such a background phase distribution, which not only enables good reconstruction but moreover can be realized with available means, namely by using at least one spatially selective radio frequency pulse. Towards this end, a background phase distribution is determined by means of the optimization method, the portion of which to be generated by the spatially selective radio frequency pulse (background phase offset distribution) has a predetermined "smoothness" such that it can be realized by means of the spatially selective radio frequency pulse. The term "smoothness" within the scope of this description means that the spatial variation of the phase distribution is limited, which again means that the phase values of the spatial distribution may change with position only with such a speed that the spatial resolution of the spatially selective radio frequency pulse is sufficient to experimentally implement this change with appropriate accuracy. If the phase distribution does not show this "smoothness" at certain locations, one refers to "jumps" in the phase distribution. In this connection, it should be taken into consideration that in this case, the smoothness is exclusively defined via the spatial resolution of the radio frequency pulse, i.e. that also variations of the phase distribution, which would colloquially be called "steps" or "bends", are also included by the term smoothness if the resolution of the spatially selective radio frequency pulse is sufficient to realize them. This resolution depends, in general, on numerous experimental parameters and also on the apparatus that is used.

In order to realize this requirement for experimental realizability of the background phase offset distribution, in accordance with the invention, a boundary condition in the form of a limitation of the spatial variation of the background phase offset distribution is integrated into the optimization algorithm.

Variants and further advantageous properties and designs of the invention are described below.

One preferred variant utilizes the k space symmetries which are conjugated in reconstruction. The additional information content, which is incorporated in the reconstruction process due to utilization of these symmetries, and therefore the degree to which the reconstruction quality can be improved, decisively depends on the background phase of the MR signal distribution as already described by means of the example of the "Virtual Coil Concept".

Performance of phase-limited image reconstruction is alternatively also possible in order to condition the reconstruction problem more favorably. One thereby utilizes the influence of the background phase on this condition of the phase-limited image reconstruction.

In one particularly preferred variant, k space is not completely sampled during acquisition of the MR signals. Subsampling of k space is performed e.g. in parallel imaging in the form of undersampling (only every nth line in k space is acquired) or in the Half Fourier method, in which only part of k space is acquired.

The inventive method is particularly advantageous when the acquisition of the MR signals is performed by means of at least two receiving elements of a receiving antenna array e.g. for experiments of parallel imaging. Since this is mostly performed in order to reduce the number of acquired data points, such experiments frequently have significant reconstruction problems and can be particularly improved by the inventive method.

In one preferred further development of this variant, acquisition of the MR signals and reconstruction are performed in accordance with the SENSE method. In the SENSE method, the subsampled k spaces of the individual receiving antennas are directly subjected to Fourier transformation, which results in images with convolution artefacts, in which several points of the image, which would be generated with full sampling, are convoluted on top of each other. A linear system of equations can then be established by means of the information contained in the sensitivities for deconvolution of the image points, the condition of which depends i.a. on the relative but not the absolute phases of the sensitivities at the corresponding image points. When it is desired to optimize the effective sensitivities and therefore the reconstruction quality in the "Virtual Coil Concept" through specific adjustment of the background phase, the background phase is virtually freely adjustable for a plurality of image points without changing the reconstruction condition. The phase of the other image points then results from the above-mentioned relative phase relationships.

In another variant of the inventive method, acquisition of the MR signals and reconstruction are performed in accordance with the GRAPPA method.

The signal-to-noise ratio in the reconstructed image is advantageously used as a criterion for the reconstruction quality.

In a further development of this variant, a geometry factor, which specifies the spatially dependent noise increase caused by reconstruction within the scope of a parallel imaging method, is used as a criterion for the reconstruction quality.

The strength of artefacts in the reconstructed image can alternatively or additionally be used as a criterion for the reconstruction quality.

Within the scope of the optimization algorithm, at least two different distributions of the background phase are advantageously examined with respect to the achieved reconstruction quality and that background phase distribution is selected which produces the best reconstruction quality.

In a particularly preferred variant, at least in the imaging area of the object (area to be imaged) a spatial grid with grid points is defined and the optimization algorithm determines the background phase for each individual grid point in a search. One measure to meet the boundary condition consists in that this search is performed only within a certain phase value range which depends on the phase values at those grid points for which the search has already been performed. The phase value range for a selected grid point advantageously depends only on the phase values at those grid points which are located in the closer vicinity of the selected grid point, in particular, on those of neighboring grid points. In this fashion, one can determine, for example, that the background phase offset shall change with respect to the background phase offset of neighboring points by maximally $+/-\pi/2$. Fulfilment of this boundary condition can be requested for the overall imaging area or also only within certain partial areas of the imaging area. In the latter case, there might still be phase jumps at the boundaries of the partial areas, which can either not be realized exactly or only with great expense.

For this reason, it may be advantageous when a measure for fulfilment of the boundary condition consists in that in a first step of the optimization algorithm, a preliminary background phase offset distribution is determined and that in a second step spatial jumps of the preliminary background phase offset distribution are eliminated by adding at least one further spatial phase distribution to the preliminary background phase offset distribution which substantially does not change the reconstruction quality. The background phase offset distribution to be generated by means of the spatially selective RF pulses is then the sum of the preliminary background phase offset distribution and of the further spatial phase distributions.

A background phase offset distribution may e.g. be provided as preliminary background phase offset distribution, in which (as described above) the phase value range was limited with respect to neighboring grid points at first only within individual areas such that there might still be jumps of the background phase offset distribution at the boundaries of the areas.

"Substantially unchanged reconstruction quality" means that the reconstruction quality lies within predetermined (in dependence on the application) acceptable limits.

Realization of the background phase offset distribution is facilitated by spatially selective pulses through addition of a further spatial phase distribution and the resulting elimination of jumps in the background phase offset distribution. This can (but must not) be realized at the cost of the reconstruction quality. For this reason, an acceptable degree of deterioration of the reconstruction quality must be determined.

Since the spatial resolution of the spatially selective radio frequency pulse used is decisive for determining which spatial phase changes can be realized, the spatial variation of the background phase offset distribution is advantageously limited in dependence on the spatial resolution of the at least one spatially selective radio frequency pulse used. The exact magnitude of limitation of the spatial variation of the background phase offset distribution thereby depends on the type of spatially selective radio frequency pulse that is used. For example in B1 tailoring, only phase distributions can, in general, be generated which vary relatively slowly with respect to space, whereas the resolution can be improved by means of ZRSHFP if only within relatively narrow limits in dependence on the experiment, since, with excessively high resolution, the durations of ZRSHFP quickly become long and impracticable.

In one particularly preferred variant of the inventive method, the at least one spatially selective radio frequency pulse is a spatially selective radio frequency pulse that is based on an additional magnetic field. The use of additional magnetic fields is one of several variants of providing radio frequency pulses with spatial selectivity.

In a further particularly advantageous variant of the inventive method, the application of at least one of the spatially selective radio frequency pulses is performed using at least two transmitting elements of a transmitting antenna array. The use of a plurality of transmitting elements is a further variant of providing radio frequency pulses with spatial selectivity.

In the optimization algorithm, a background phase distribution is advantageously determined relative to an initial background phase distribution determined in a preliminary experiment or through calculation.

In the previous methods for improving the reconstruction quality in an MR imaging experiment through generation of an optimum spatial distribution of the background phase, the optimum distribution was determined through an optimization algorithm, the optimization algorithm merely taking into consideration the influence of the background phase on the reconstruction condition. As already described above, the phase distributions resulting from such an algorithm contain, in general, very small-scale phase variations or phase jumps which negatively influence the experimental realizability of such a background phase using spatially selective pulses.

The inventive method takes advantage of the fact that there are, in general, several spatial dependencies of the background phase which produce good image reconstruction quality. In many cases, there is even a series of different background phase distributions which are equally optimum with respect to the reconstruction quality. In these cases, the optimization algorithms of the previous methods normally do not provide an unambiguous solution but only one of many possible background phase distributions which are equivalent with respect to reconstruction quality.

The optimization algorithm in the inventive method is designed to determine a background phase distribution from the plurality of phase dependencies that improve reconstruction with that background phase distribution being capable of realization by at least one spatially selective radio frequency pulse with certain predetermined properties and which is optimum for the image reconstruction quality under this boundary condition. The predetermined properties of a spatially selective radio frequency pulse may include in this case i.a. the fact whether it is a spatially selective radio frequency pulse based on an additional magnetic field, and if so which resolution can be achieved for the spatial selectivity through spatial field distribution and the time dependence of the additional magnetic fields. One further property would be the number of transmitting antennas by means of which the radio frequency pulse is irradiated. The design of a spatial dependence of the background phase and therefore the degree of limitation of the spatial variation of the background phase offset distribution to be selected then depends on the totality of these properties. It must thereby be mentioned that there is no "hard" limit for realizability. Rather, the experimenter must determine which error he/she is willing to accept for the experimentally generated background phase. In dependence on this, there will be a "trade off" between suitability of the background phase for improving the reconstruction quality and suitability of the background phase for experimental realization within the scope of the optimization algorithm. In the most favorable case, in case of a large number of equivalent background phase distributions for which the reconstruction quality alone is optimum, a phase distribution can be found which equally meets both criteria without limitation.

Further advantages of the invention can be extracted from the description and the drawing. The features mentioned above and below may be used in accordance with the invention either individually or collectively in arbitrary combination. The embodiments shown and described are not to be understood as exhaustive enumeration but have exemplary character for describing the invention.

The invention is illustrated in the drawing and is explained in more detail with reference to an embodiment.

DESCRIPTION OF THE PREFERRED EMBODIMENT

Figure 1:
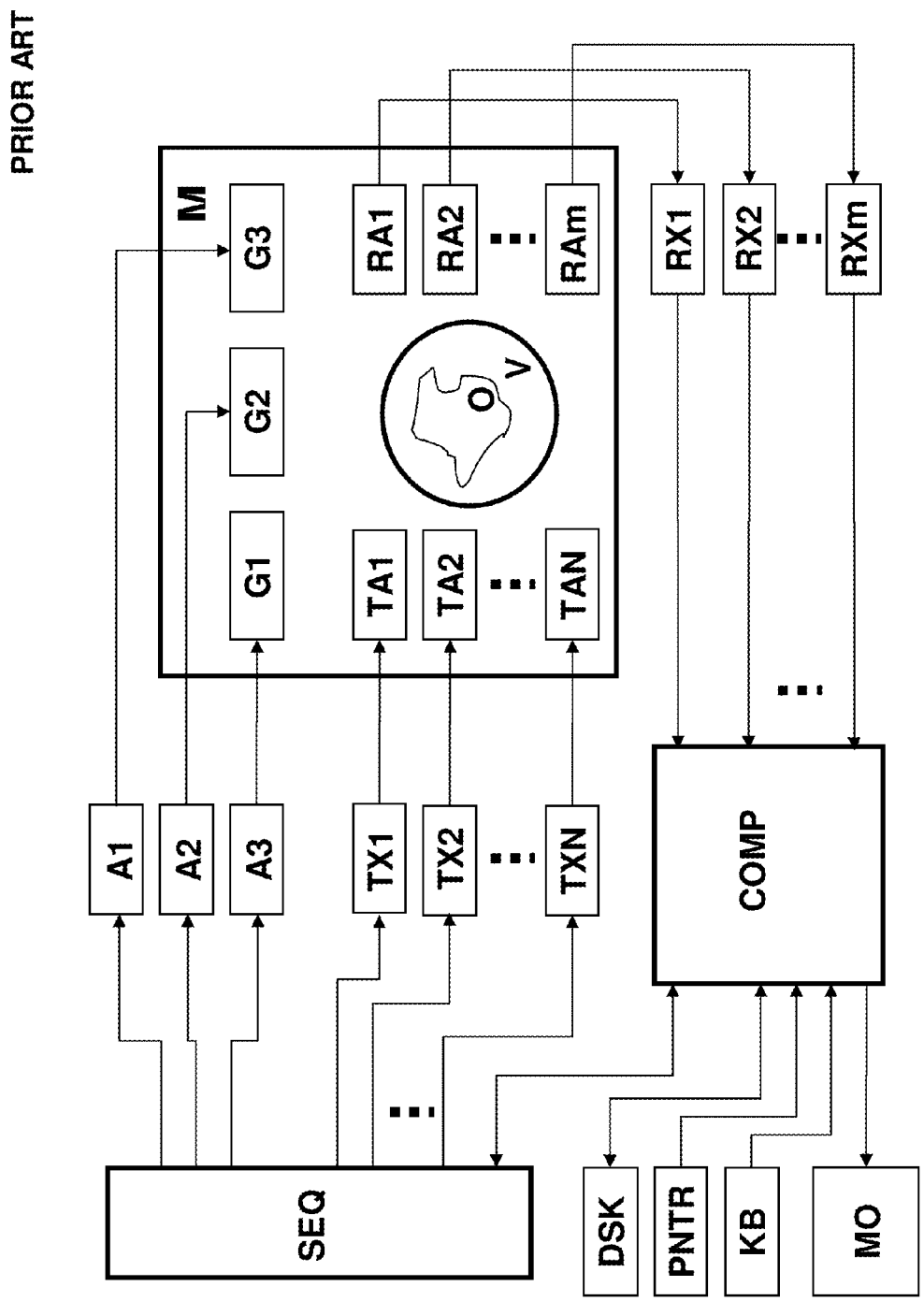
FIG. 1 shows a schematic view of an MR measuring apparatus according to prior art which is suitable to perform the inventive method.

FIG. 1 schematically shows an MR measuring apparatus which is suited to perform the inventive method. The apparatus comprises a main magnet M which generates the basic magnetic field which is substantially homogeneous and static in a measuring volume V. The part of the object under investigation, which is contained in the measuring volume V, is called object under investigation or shortly object O. A so-called gradient system is introduced into the bore of the main magnet M which surrounds the measuring volume V and realizes different characteristics of additional magnetic fields by switching generally several coils of coil combinations G1, G2, G3, . . . . By way of example, FIG. 1 shows three coil combinations of this type G1, G2, and G3. The gradient system can superimpose additional magnetic fields of controllable duration and strength on the basic field. The gradient coil sets G1, G2, and G3 are supplied with electric current for generating the additional fields using gradient amplifiers A1, A2, A3 which are controlled by a sequence control unit SEQ for perfectly timed generation of gradient pulses.

There are several transmitting elements TA1, to TAN within the gradient system, which, in their entirety, are also called a transmitting antenna device. They surround the object under investigation O or at least one area of the object Oto be imaged (imaging area) and are fed by several independent RF power transmitters TX1 . . . TXN. The RF waveforms generated by these RF power transmitters TX1 . . . TXN are determined by the sequence control unit SEQ and triggered at the correct time. The transmitting elements TA1 to TAN irradiate RF waveforms onto the object under investigation O located in the volume under investigation V, where they excite nuclear spins. The generated magnetic resonance signals are converted by one or more RF receiving elements RA1, . . . RAm into electric voltage signals which are then fed into a corresponding number of receiver units RX1, . . . RXm. The entirety of the receiving elements RA1, . . . RAm is also called receiving antenna device, consisting of m receiving elements RA1, . . . RAm. They are also located within the gradient coils G1, G2, G3 and surround the object under investigation O.

In order to reduce the equipment costs, the transmitting and receiving antenna devices may also be designed and connected in such a fashion that one or a plurality of the transmitting elements TA1 to TAN are also used to receive magnetic resonance signals. In this case, which is not taken into consideration in FIG. 1, switching between transmitting and receiving operation is provided by one or a plurality of electronic duplexers which are controlled by the sequence control unit SEQ, i.e. during the RF transmitting phases of the performed pulse sequence, this/these antenna(s) is/are connected to the corresponding RF power transmitter(s) and is/are separated from the associated receiver channel(s), whereas for the receiving phases, the transmitter(s) is/are separated and the receiver channel(s) is/are connected.

The received signals are amplified by the receiver units RX1 to RXm, illustrated in FIG. 1, are converted into digital signals using conventional signal processing methods, and are transferred to an electronic computer system COMP. In addition to reconstruction of images and spectra and derived quantities from the received measured data, the control computer system COMP is used to operate the overall MR measuring apparatus and initiate performance of the pulse sequences through corresponding communication with the sequence control unit SEQ. The user-guided or automatic performance of programs for adjusting the measurement apparatus properties and/or for generating magnetic resonance images is also performed on this control computer system COMP as is representation of the reconstructed images as well as storage and administration of the measured data and image data and control programs. In order to perform these tasks, this computer system has at least one processor, one main storage, a computer keyboard KB, a pointer device PNTR, e.g. a mouse, a monitor MON and an external digital storage unit DSK.

Performance of the inventive method using such an MR measuring apparatus is explained below with reference to a specific embodiment. The method is performed here, by way of example, using as an example the application of the "Virtual Coil Concept" to a two-dimensional SENSE PI experiment with reduction factor 5 in a slice of a water bottle. In this connection, a combined transmitter/receiver antenna device is used which is designed in the form of a transmitter/receiver antenna array with eight transmitter/receiver elements which are arranged on a cylinder.

It should be noted that the inventive method can analogously also be used in other PI methods, such as e.g. GRAPPA, and moreover also for 3-dimensional experiments. Subsampling in k space may thereby be performed in only one or also in two or three dimensions.

Optimization of the Background Phase

Figure 2:
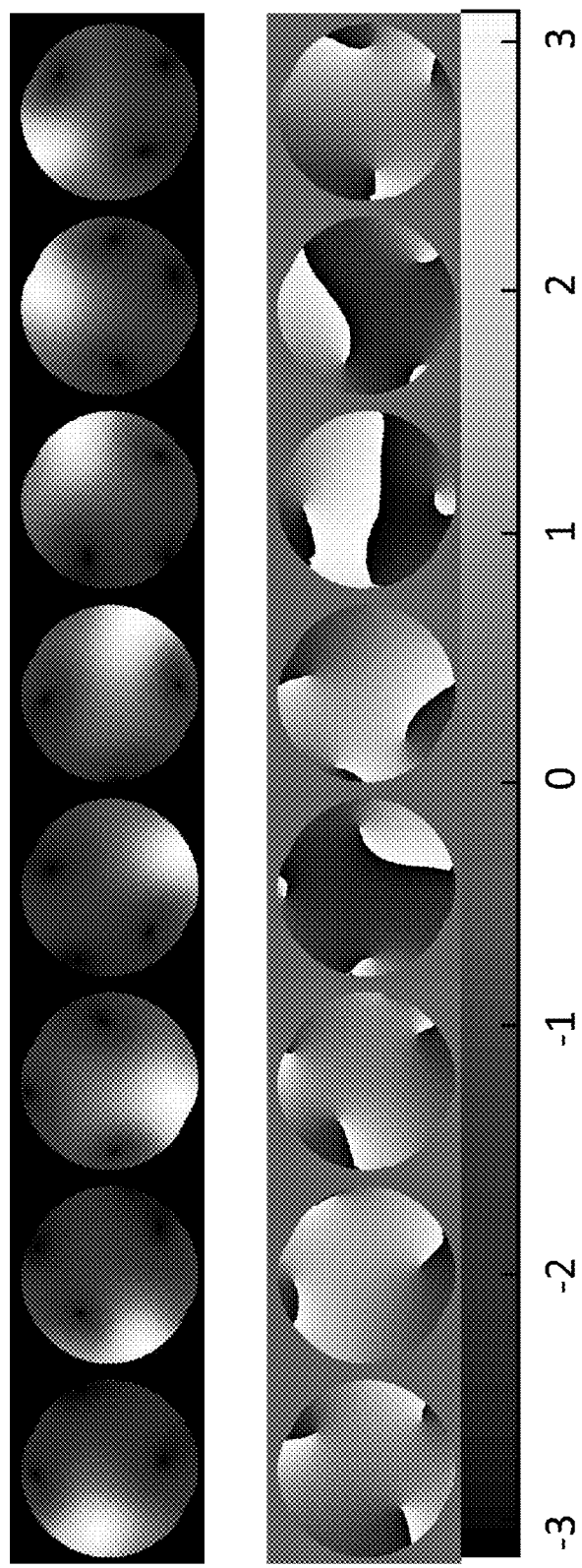
FIG. 2 shows the complex-valued effective sensitivities of 8 receiving elements of a receiving antenna array which is used to perform the inventive method.

In a first step, the complex-valued effective sensitivities $D_j$ of the individual receiving elements $j=1 \ldots 8$ are determined for the selected slice which, in the present case, represents the imaging area of the object under investigation (see FIG. 2; first line: spatial amplitude dependence; second line: spatial phase dependence). In the present case, spin-echo images with full sampling from the individual coils were divided by their sum-of-squares image, wherein the phase of the individual images, which already represents the combined phase of receiving field phase and background phase, is maintained. In this fashion, the effective sensitivities $D_v$ of the virtual coils can be directly calculated from these effective sensitivities of the real coils by using equation $D_v(x)=D_j^*(x)$. The excitation and refocusing radio frequency pulses of the spin echo experiment were irradiated using the transmitting antenna array, which was operated for this purpose in a so-called circular polarized mode (CP mode).

The measured or calculated real and virtual effective sensitivities contain an a priori background phase, the dependence of which is determined i.a. by the irradiated RF pulses, by switched additional magnetic fields in addition to spatial encoding, and experiment parameters such as off-resonance distribution, echo times etc. By means of the inventive optimization method, a background phase or a background phase offset, which is optimum for a SENSE experiment with reduction factor 5, is then determined from the effective sensitivities $D_v$, $D_j$, which is subsequently to be generated by means of at least one spatially selective radio frequency pulse (background phase offset=portion of the background phase distribution to be generated using a spatially selective radio frequency pulse). This at least one spatially selective radio frequency pulse must be designed such that it changes the background phase of the MR signal distribution by the background phase offset resulting from the optimization with respect to the background phase as it occurs when the CP mode is used.

As already described above, the inventive optimization method is designed such that the reconstruction quality is optimized under the boundary condition of experimental realizability. This was achieved in the present embodiment using the optimization algorithm described below.

Figure 3:
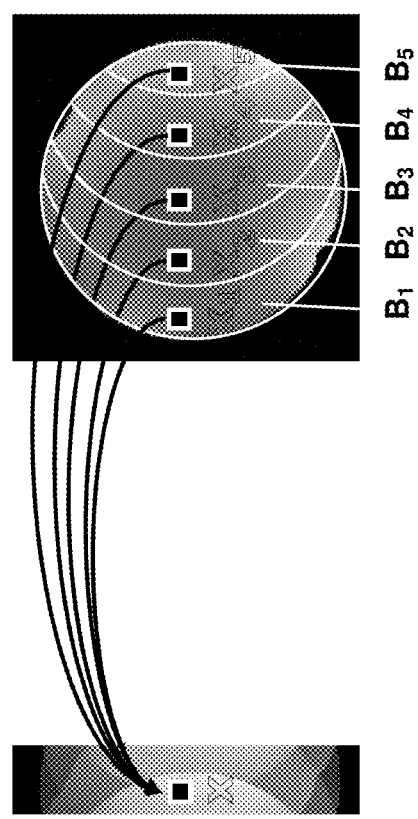
FIG. 3 shows an MR image with convolutions, acquired using parallel imaging, in which a group of grid points within an acquired slice of the object under investigation are super-imposed in one single image point of the MR image obtained by Fourier transformation as a consequence of subsampling of k space, and an image without convolution of the acquired slice of the object under investigation.

In the illustrated example, a spatial grid with grid points is initially disposed on the acquired slice of the object under investigation and a grid point is selected. All further grid points of the acquired slice are then identified, the image points of which would coincide in simple Fourier reconstruction due to subsampling in k space. In a SENSE experiment with reduction factor 5, the acquired slice is thereby decomposed into 5 areas $B_1$, $B_2$, $B_3$, $B_4$, $B_5$, wherein one grid point from each area belongs to each group of coinciding grid points. This is schematically shown in FIG. 3 by way of example. The left-hand illustration of FIG. 3 shows a convoluted image of the object with reduced FOV (field of view) and the right-hand illustration shows the reconstructed image, which shows the points $X_1$, $X_2$, $X_3$, $X_4$, $X_5$ which coincide at point X in the convoluted image. The points $X_1$, $X_2$, $X_3$, $X_4$, $X_5$ which coincide at point X in the convoluted image form a tuple of image points.

By means of a complete "brute force" variation, one tuple of phase offsets is then determined for each tuple of image points, which results in a minimum g factor for the corresponding image points when adding this phase offset tuple to the background phase and therefore to the phase of the real effective sensitivities at the corresponding grid points prior to calculation of the virtual effective sensitivities. For each phase offset tuple to be evaluated in the search, the g factor for the i-th image point of the coinciding image points is calculated according to the following formula:

$$g_i = \sqrt{((D^H D)^{-1})_{i,i} (D^H D)_{i,i}} \qquad (5)$$

Analogously to the description in reference [4], the matrix D thereby includes the effective sensitivity values of the individual real and virtual receiving antennas at the coinciding grid points.

As described in reference [1], a simplex search algorithm can also be used instead of the brute force search in order to find a phase offset tuple producing a minimum g factor.

The g factor values at the coinciding image points $X_1$, $X_2$, $X_3$, $X_4$, $X_5$ are each linked to one another such that a variation of the phase at these points has an effect on all of these g factor values. In the present embodiment, the square mean of these i linked g factor values is minimized and designated by minimum g factor. It is also possible to select a different optimization criterion such as e.g. a minimum arithmetic mean or a minimum maximum value.

Figure 4:
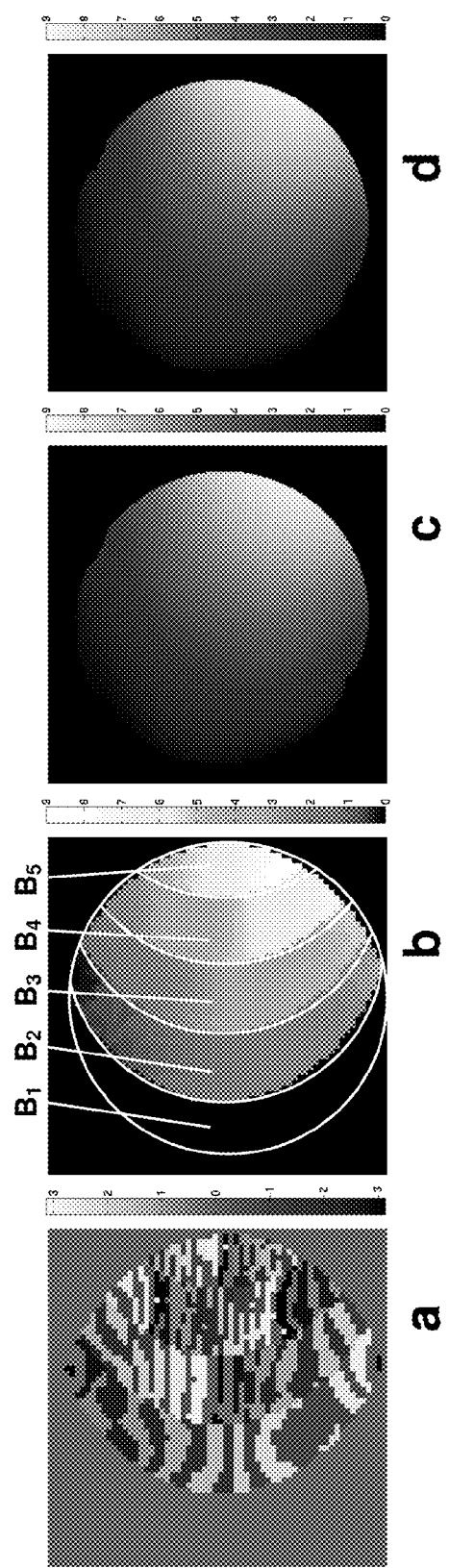
FIG. 4a shows an optimized spatial distribution of the background phase offset which typically results from an optimization algorithm according to prior art.
FIGS. 4b-c show distributions of the background phase offset which are determined in steps according to a variant of the inventive method.
FIG. 4d shows an experimentally realized distribution of the background phase offset according to the inventive method.

If this search were performed independently for all grid points of the slice, one would obtain a spatial distribution for the background phase offset to be realized as illustrated in FIG. 4a. One can see clearly the extremely small-scale phase variations and phase jumps which render realization using spatially selective radio frequency pulses practically impossible. The distribution illustrated herein shows jumps on the grid with a separation between the grid points of 1 mm. It should be noted that even a ZRSHFP, the dependence of the additional magnetic fields of which defines a nominal excitation resolution of 1 mm, cannot absolutely and exactly realize this resolution and for this reason the illustrated phase variations in general. The reasons therefore are experimental, technical and physical limitations and imperfections.

Boundary Condition

In accordance with the invention, the optimization method is modified in such a fashion that a distribution of the background phase offset is determined, which is sufficiently smooth such that the determined background phase offset can be realized through spatially selective RF pulses.

For this reason, the optimization algorithm of the inventive method contains a limitation of the spatial variation of the background phase offset as a boundary condition, which is realized as follows in the present embodiment:

For searching the phase offset tuple, the phase offset for the grid point from the first area $B_1$ is initially set to zero. Then the phase offset for the grid points in the other areas $B_2$-$B_5$ is varied, wherein it is ensured that the phase offset relative to the phase offset of neighboring points from the same area $B_2$-$B_5$ is changed by maximally $+/-\pi/2$. This can be realized without limiting the most general case, since a rotation of the background phase by a factor of $\pi$ would merely correspond to an exchange between real and virtual coils, which has no influence on the g factor. This first measure achieves a determined offset for the background phase between neighboring grid points within an area $B_1$-$B_5$ which varies only slightly and does not have any abrupt jumps. The spatial dependence of the optimum offset for the background phase, which results from the optimization algorithm with this additional feature, is illustrated in FIG. 4b. It clearly shows that the phase within the individual areas $B_1$-$B_5$ has a smooth dependence.

The search may initially alternatively also be performed without limitation, and jumps of $\pi$ can be eliminated by an additional phase offset of $\pi$ at corresponding points.

If the phase still varies excessively after the search, which is limited to $+/-\pi/2$, or e.g. has an excessively strong phase gradient, limitation to smaller variation intervals between neighboring grid points can also be easily determined. For this reason, one might possibly not find the optimum dependence for the reconstruction quality, but still a smooth dependence that can be realized, which also reduces the g factor.

In FIG. 4b, there are still phase jumps at the transitions between the areas $B_1/B_2$, $B_2/B_3$, $B_3/B_4$, $B_4/B_5$, which would further oppose experimental realizability of this phase offset. For this reason, a further step was added to the optimization algorithm in this variant of the inventive method, which contributes to fulfilment of the boundary condition: In a post-processing step, which is applied to the phase offset distribution of FIG. 4b, the phase jumps between the areas $B_1/B_2$, $B_2/B_3$, $B_3/B_4$, $B_4/B_5$ are eliminated, thereby utilizing the fact that the g factor according to equation (5) only depends on the relative phases of the effective sensitivity values at the individual coinciding grid points such that a phase offset of the tuple can be freely selected without changing the g factor provided that the differences of the phase offset within the tuple are maintained. On the basis of this finding, a phase ramp is added to each line of the phase offset distribution in the first area, which connects the phase zero at the object start, i.e. at the first grid point of the first area, to the phase of the first point in the second area. In order to maintain the relative phase within the respective tuples, the same phase ramp must then be added in the other areas. The determined phase distribution can be additionally smoothed through filtration or fitting of functions in order to eliminate remaining small jumps or the influence of noise. Moreover, it can be masked to a previously determined relevant area. As a result of this step, one obtains the phase offset distribution of FIG. 4c, in which the jumps between the areas have disappeared and which is sufficiently smooth. These measures have limited the spatial variation of the phase offset distribution in such a fashion that the maximum phase gradient is 0.4 rad/mm in the present case, which can be realized with sufficient accuracy with the spatially selective radio frequency pulse used in the experiment. This is confirmed by FIG. 4d, which shows the distribution of the experimentally realized offset of the background phase.

Instead of determining the optimum phase distribution on the basis of a minimum SENSE g factor, it is also possible to use other criteria.

For example, for the GRAPPA method, there is also an algorithm for calculating the GRAPPA g factor, which does not require explicit previous measurement of sensitivities and is only based on the real and virtual k space data. The input data can, in principle, also be varied in this algorithm to derive an optimum phase distribution.

An optimized background phase for a GRAPPA experiment could e.g. be determined as follows: At first, so-called GRAPPA reference lines in the center of k space are acquired. These are normally used to calculate the GRAPPA weighting factors which state how missing k space points are calculated from a weighted summation of neighboring k space points using the data from all receiving antennas. In order to determine the optimized background phase, it is then possible to calculate low-resolution images of the individual receiving elements from these reference lines using Fourier transformation. A complete background phase offset distribution can then be added to these images, a new Fourier transformation can be performed in k space and the GRAPPA weight factors can be calculated, from which a spatial distribution of the GRAPPA-g factor can be calculated, which is then used as optimization criterion. Within the scope of optimization, the offset background phase distribution would then be varied and that background phase offset distribution would be selected from the amount of variations, which produces the optimum g factor distribution. The boundary condition could be met in such a case by adding in the first place only those background phase offset distributions to the variation which already take into consideration the boundary condition. In a first step of the optimization algorithm, a preliminary background phase offset distribution may alternatively also be determined again, wherein initially also background phase offset distributions are admitted in the variation, which do not meet the boundary condition. In a second step, spatial jumps of the preliminary phase offset distribution are eliminated by adding at least one further spatial phase distribution to the preliminary phase offset distribution, which substantially does not change the reconstruction quality.

This method of variation of the background phase distribution through adding entire background phase distributions for determining an optimized background phase distribution is naturally not limited to the GRAPPA method but can analogously also be used for other re-construction methods, in particular, also for the SENSE method.

Since many principles in the different PI methods are analogous, it is also possible to optimize a background phase distribution for a certain PI method and then also use this distribution for other PI methods.

Another approach to find a phase distribution that can be generated by an RF pulse can, in certain cases, also be as follows: The sensitivity cards can initially be interpolated to a low-resolution grid, wherein the grid resolution is selected such that it can be realized by the spatially selected RF pulse to be used (also with certain imperfections). Subsequently, the search for the optimum phase distribution on the low-resolution grid is performed as described above and then interpolated back to a higher-resolution original grid. The phase variations found in this fashion can then be generated by the RF pulse and are simultaneously optimum under this boundary condition. Under certain circumstances, this variant of the method can also be combined with components of the above-described variant and e.g. in order to obtain a still smoother phase distribution, phase jumps of $\pi$ can also be eliminated.

MR measurement with optimized background phase distribution

After determination of this optimum background phase which can be realized using spatially selective radio frequency pulses, the actual PI experiment is then performed.

This is a spin echo experiment, in which k space is subsampled with a factor 5. It is thereby important that this experiment (except for the spatially selective pulses) is performed with the same parameters, which influence the background phase, as the experiment for determining the sensitivities. The excitation in this spin echo experiment is performed by means of a spatially selective radio frequency pulse, in the present example by a spatially selective radio frequency pulse based on an additional magnetic field, which generates the previously determined background phase offset and thereby optimizes the reconstruction quality. This spatially selective radio frequency pulse was generated according to one of the conventional calculation methods, wherein the transmitting sensitivity profiles, introduced into this calculation, of the individual elements of the transmitting antenna array were determined relative to the transmitting sensitivity profile of the CP mode. This directly yields the required property that the spatially selective radio frequency pulse changes the background phase of the MR signal distribution by the background phase offset resulting from the optimization with respect to the background phase as it occurs when the CP mode is used.

Figure 5:
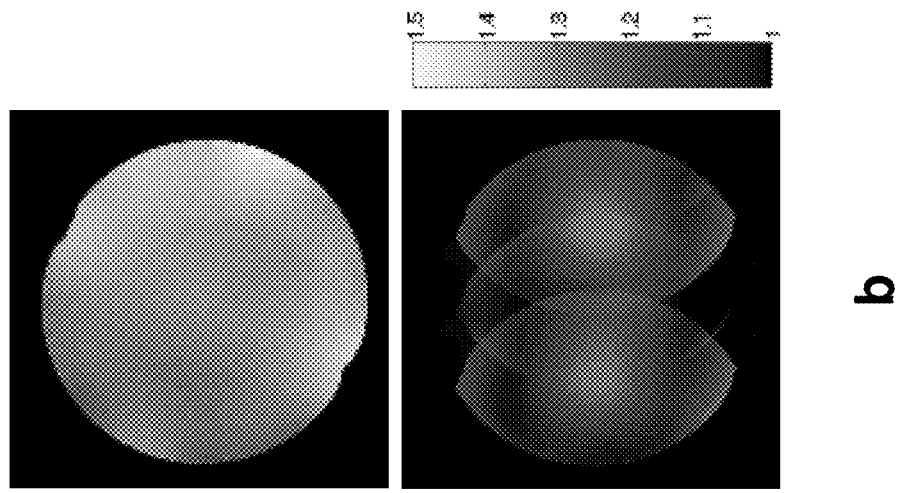
FIG. 5 shows MR images and spatial distributions of the g factor which result from a SENSE-PI experiment without and with optimized background phase.
Figure 5:
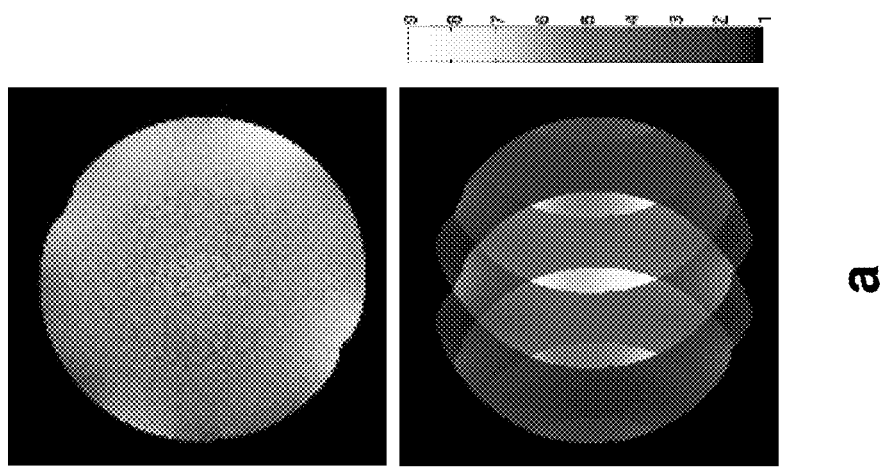

The improvement of the reconstruction quality obtained with the inventive method is clearly shown in FIG. 5. It shows the spin echo image acquired with a reduction factor 5 and reconstructed with SENSE as well as the spatial distribution of the g factor once for a non-optimized background phase (FIG. 5*a*) and also for the optimized background phase determined by the inventive method and generated by means of the spatially selective radio frequency pulse (FIG. 5*b*).

In summary, it can be established that in the inventive method, the spatial dependence of the background phase of the MR signal distribution is generated using at least one spatially selective radio frequency pulse, wherein the background phase offset generated by the spatially selective radio frequency pulse is determined in such a fashion that it results in an optimum reconstruction quality and also can be realized experimentally.

LIST OF REFERENCE NUMERALS

A Array element
A1, A2, A3 Gradient amplifier
$B_1, B_2, B_3, B_4, B_5$ Areas of the slice of the object under investigation, which coincide in the convoluted image
COMP Computer system
DSK Storage unit
G1, G2, G3 Gradient coils
KB Computer keyboard
M Main magnet
MON Monitor
Object under investigation
PNTR Pointer device
RA1 . . . m RF receiving elements
RX1 . . . m Receiver units
SEQ Sequence control unit
TA1 . . . n RF transmitting elements
TX1 . . . n RF power transmitter
V Measuring volume
X Point of an image reconstructed by simple Fourier transformation with convolutions
$X_1, X_2, X_3, X_4, X_5$ Points of the deconvoluted image which coincide at point X in the convoluted image

REFERENCES

[1] Blaimer M, Gutberlet M, Kellman P, Breuer F A, Köstler H, Griswold M A. *Virtual Coil Concept for Improved Parallel MRI Employing Conjugate Symmetric Signals.* Magnetic Resonance in Medicine 61 (2009), S. 93-102

[2] Sodickson D K, Manning W J. Simultaneous acquisition of spatial harmonics (SMASH): fast imaging with radiofrequency coil arrays. Magn Reson Med 1997; 38(4): 591-603.

[3] Griswold M A, Jakob P M, Heidemann R M, Nittka M, Jellus V, Wang J, Kiefer B, Haase A. Generalized autocalibrating partially parallel acquisitions (GRAPPA). Magn Reson Med 2002; 47(6):1202-1210.

[4] Pruessmann K P, Weiger M, Scheidegger M B, Boesiger P. SENSE: sensitivity encoding for fast MRI. Magn Reson Med 1999; 42(5):952-962.

[5] Bydder M, Robson M D. *Partial fourier partially parallel imaging.* Magnetic Resonance in Medicine 53 (2005), S. 1393-1401

[6] Willig-Onwuachi J D, Yeh EN, Grant A K, Ohliger M A, McKenzie C A, Sodickson D K. *Phase-constrained parallel MR image reconstruction.* Journal of Magnetic Resonance 176 (2005), S. 187-198

[7] Seifert F, Wuebbeler G, Junge S, Rinneberg H. B1(+) steering by an adaptive 4-channel transmit/receive coil array. Proc 12th Scientific Meeting, Intl Soc Magn Reson Med, Kyoto (2004), S. 1569

[8] Pauly J, Nishimura D, Macovski, A. *A k-space analysis of small-tip-angle excitation.* Journal of Magnetic Resonance 81 (1989), S. 43-56.

[9] Katscher U, Börnert P, Leussler C, van den Brink J S. *Transmit SENSE.* Magnetic Resonance in Medicine 49 (2003), S. 144-50.

[10] Xu, D, King K F, Zhu Y, McKinnon G C, Liang, Z. P. *Designing Multichannel, Multidimensional, Arbitrary Flip Angle RF Pulses Using an Optimal Control Approach,* Magnetic Resonance in Medicine 59 (2008), S. 547-560.

[11] Haas M, Ullmann P, Schneider J T, Ruhm W, Hennig J, Zaitsev M. *Large Tip Angle Parallel Excitation Using Nonlinear Non-Bijective PatLoc Encoding Fields.* Proc 18th Scientific Meeting, Intl Soc Magn Reson Med, Stockholm (2010), S. 1569

[12] Breuer F A, Kannengiesser S A R, Blaimer M, Seiberlich N, Jakob P M, Griswold M A. *General Formulation for Quantitative G-factor Calculation in GRAPPA Reconstructions.* Magnetic Resonance in Medicine 62 (2009), S. 739-746

We claim:

1. A method for magnetic resonance (MR) imaging for imaging an imaging area of an object, wherein a reconstruction image quality depends on a spatial distribution of background phase, the method comprising the steps of:
   a) determining a background phase distribution using an optimization algorithm having a reconstruction quality as an optimization criterion, wherein limitation of a spatial variation of a background phase offset distribution is integrated as a boundary condition in the optimization algorithm;
   b) applying at least one spatially selective radio frequency pulse, said at least one spatially selective radio frequency pulse contributing to generation of an MR signal distribution having a previously determined background phase distribution, wherein the at least one spatially selective radio frequency pulse generates the background phase offset distribution as a part of the background phase distribution;
   c) acquiring MR signals;
   d) reconstructing a spatial MR signal distribution; and
   e) storing and/or displaying an MR image.

2. The method of claim 1, wherein conjugated k space symmetries are utilized for reconstruction.

3. The method of claim 1, wherein phase-limited image reconstruction is performed.

4. The method of claim 1, wherein k space is not completely sampled during acquisition of the MR signals.

5. The method of claim 1, wherein acquisition of the MR signals is performed by means of at least two receiving elements of a receiving antenna array.

6. The method of claim 5, wherein acquisition of the MR signals and reconstruction are performed in accordance with a SENSE method.

7. The method of claim 5, wherein acquisition of the MR signals and reconstruction are performed in accordance with a GRAPPA method.

8. The method of claim 1, wherein a signal-to-noise ratio in a re-constructed image is used as a criterion for reconstruction quality.

9. The method of claim 5, wherein a geometry factor which specifies a spatially dependent noise increase caused by reconstruction within a scope of a parallel imaging method, is used as a criterion for reconstruction quality.

10. The method of claim 1, wherein a strength of artefacts in a re-constructed image is used as a criterion for reconstruction quality.

11. The method of claim 1, wherein within a scope of the optimization algorithm, at least two different background phase distributions are examined with respect to achieved reconstruction quality and a background phase distribution is selected which produces a best reconstruction quality.

12. The method of claim 1, wherein at least in an imaging area of the object, a spatial grid with grid points is defined and the optimization algorithm determines the background phase for each grid point individually in a search, and one measure to meet the boundary condition consists in that this search is performed only within a certain phase value range which depends on phase values at those grid points for which the search has already been performed.

13. The method of claim 1, wherein a measure for fulfilment of the boundary condition consists in that, in a first step of the optimization algorithm, a preliminary background phase offset distribution is determined and, in a second step, spatial jumps of the preliminary background phase offset distribution are eliminated by adding, to the preliminary background phase offset distribution, at least one further spatial phase distribution which substantially does not change reconstruction quality.

14. The method of claim 1, wherein limitation of the spatial variation of the background phase offset distribution is performed in dependence on a spatial resolution of the at least one spatially selective radio frequency pulse.

15. The method of claim 1, wherein at least one of the spatially selective radio frequency pulses is a spatially selective radio frequency pulse based on an additional magnetic field.

16. The method of claim 1, wherein application of at least one of the spatially selective radio frequency pulses is performed by means of at least two transmitting elements of a transmitting antenna device.

17. The method of claim 1, wherein the optimization algorithm determines a background phase distribution relative to an initial background phase distribution determined in a preliminary experiment or through calculation.

* * * * *